United States Patent [19]

Volk

[11] Patent Number: 5,537,069
[45] Date of Patent: Jul. 16, 1996

[54] APPARATUS AND METHOD FOR SELECTING A TAP RANGE IN A DIGITAL DELAY LINE

[75] Inventor: Andrew M. Volk, Loomis, Calif.

[73] Assignee: Intel Corporation, Santa Clara, Calif.

[21] Appl. No.: 413,951

[22] Filed: Mar. 30, 1995

[51] Int. Cl.$^6$ .................................................. H03L 7/00
[52] U.S. Cl. ........................ 327/149; 327/152; 327/161; 331/57; 375/376; 375/374
[58] Field of Search .................................... 327/146, 151, 327/152, 156, 158, 160, 161, 162; 331/1 A, 17, 34, 57; 375/376, 374

[56] References Cited

U.S. PATENT DOCUMENTS

| | | | |
|---|---|---|---|
| 5,081,655 | 1/1992 | Long | 375/374 |
| 5,101,117 | 3/1992 | Johnson et al. | 307/269 |
| 5,103,185 | 4/1992 | Arai | 327/152 |
| 5,157,277 | 10/1992 | Tran et al. | 307/269 |
| 5,223,755 | 6/1993 | Richley | 307/603 |
| 5,315,271 | 5/1994 | Pascual et al. | 331/57 |
| 5,317,202 | 5/1994 | Waizman | 307/269 |
| 5,329,254 | 7/1994 | Takano | 331/57 |

Primary Examiner—Timothy P. Callahan
Assistant Examiner—Jung Ho Kim
Attorney, Agent, or Firm—Blakely, Sokoloff, Taylor & Zafman

[57] ABSTRACT

The invention is a delay locked loop circuit comprising a delay line with an input signal and a plurality of tap outputs, and a selector to select from a range of tap outputs. Each tap outputs a delayed copy of the input signal. The invention further comprises a comparator to compare the input signal to an ouput signal, and to output an indication of the phase difference between the signals. A detector coupled to the tap outputs detects a transition from a first predetermined signal level output by a first tap output to a second predetermined signal level output by a second tap output. The detector outputs an indication of the tap outputs between which the transition first occurs to a range determiner. The determiner determines a range of tap outputs to select from and outputs the determined range to the selector. The selector selects a tap output within the range, the selected tap output becoming the output signal.

24 Claims, 9 Drawing Sheets

| | | | % DELAY | | LOW LIMIT | | HIGH LIMIT | | RANGE |
|---|---|---|---|---|---|---|---|---|---|
| | CALCULATED PROGRESSION | DELAY | TO PRIOR | TO NEXT | TAP | % DELAY | TAP | % DELAY | (%) |
| 1 | 64 | 3.9 | NA | 12.2 | 0 | 49.9 | 96 | 24.5 | 73.5 |
| 2 | 80 | 4.4 | 10.9% | 10.9% | 0 | 54.5% | 112 | 21.8% | 76.4% |
| 3 | 96 | 4.9 | 9.8% | 9.8% | 64 | 19.7% | 128 | 19.7% | 39.3% |
| 4 | 112 | 5.4 | 9.0% | 9.0% | 80 | 17.9% | 160 | 26.9% | 44.8% |
| 5 | 128 | 5.8 | 8.2% | 16.4% | 96 | 16.4% | 192 | 32.9% | 49.3% |
| 6 | 160 | 6.8 | 14.1% | 14.1% | 112 | 21.2% | 224 | 28.2% | 49.4% |
| 7 | 192 | 7.8 | 12.4% | 12.4% | 128 | 24.7% | 256 | 24.7% | 49.5% |
| 8 | 224 | 8.7 | 11.0% | 11.0% | 160 | 22.0% | 288 | 22.0% | 44.0% |
| 9 | 256 | 9.7 | 9.9% | 9.9% | 192 | 19.8% | 320 | 19.8% | 39.7% |
| 10 | 288 | 10.6 | 9.0% | 9.0% | 224 | 18.0% | 384 | 27.1% | 45.1% |
| 11 | 320 | 11.6 | 8.3% | 16.6% | 256 | 16.6% | 448 | 33.1% | 49.7% |
| 12 | 384 | 13.5 | 14.2% | 14.2% | 288 | 21.3% | 512 | 28.4% | 49.7% |
| 13 | 448 | 15.4 | 12.4% | 12.4% | 320 | 24.9% | 576 | 24.9% | 49.7% |
| 14 | 512 | 17.4 | 11.1% | 11.1% | 384 | 22.1% | 640 | 22.1% | 44.2% |
| 15 | 576 | 19.3 | 10.0% | 10.0% | 448 | 19.9% | 768 | 29.9% | 49.8% |
| 16 | 640 | 21.2 | 9.1% | 18.1% | 512 | 18.1% | 896 | 36.2% | 54.3% |
| 17 | 768 | 25.0 | 15.3% | 15.3% | 576 | 23.0% | 1024 | 30.7% | 53.7% |
| 18 | 896 | 28.9 | 13.3% | 13.3% | 640 | 26.6% | 1024 | 13.3% | 39.9% |
| 19 | 1024 | 32.7 | 11.7% | NA | 768 | 23.5% | 1024 | 0.0% | 23.5% |

STEP 0.03
OFFSET = 2
EFF. 1ST TAP 66.667
TOTAL O DEL 6
TAPS 1024
RANGE 36.72
STEP FACTOR 1.15

MAX % DELAY (EXCEPTING FIRST TAPS): 15.3% | 18.1% | | 26.6% | | 36.2% | 54.3%

APPARATUS AND METHOD FOR SELECTING A TAP RANGE IN A DIGITAL DELAY LINE

BACKGROUND OF THE INVENTION

1. Field of the Invention

The invention relates to the field of phase locking circuits, and in particular to delay locked loops.

2. Description of Related Art

The synchronization of multiple clocked circuits operating in a system is a problem faced by many system designers. Synchronizing the operation of multiple circuits within a system minimizes timing errors.

In high-speed systems, the phase alignment of the clock signal at the input of each clocked circuit must be maintained with high precision. Clock signals can easily lose phase alignment when passing through intermediate circuits with variable propogation delays. Variations in propagation delay between circuits is caused by differences in circuit structure and variables in the manufacturing process. Manufacturing variables affect parameters such as gains, threshold voltages, impedances, and capacitances. The variations are often small, but even small variations can cause clock phase alignment errors when the clock frequency is on the order of 33 MHz to 66 MHz or higher.

The effect of these variations can be reduced by measuring the propagation delays of individual circuits and matching them with circuits with similar propagation delays. Such matching is, at best, inconvenient in the manufacturing and maintenance of the computer systems.

In a high-speed, multiple chip synchronous computer, the phase difference between clock signals in different parts of the system typically must be held to 100 picoseconds or less. One cause of phase differences in clock signals are propogation delays in clock buffers. Clock buffers are used throughout the system to regenerate the reference clock to drive local circuits, boosting the clock current to provide the proper fan-out. Clock buffers typically create a delay of 5 nanoseconds for 66 Mhz reference clocks (66 MHz corresponds to a 16 nanosecond clock period). If the buffer delay is not compenstated, then all of the circuits connected to the clock buffer operate 5 seconds out of phase with the referece clock. A fixed delay of 11 nanoseconds can be added onto the clock signal that the local circuits receive, so that they are in precise phase with the reference clock. The problem is that the 5 nanosecond delay of the clock buffer changes as the buffer heats up or cools down, or if the buffer's operating voltage fluctuates. An adaptive delay is required that delays the clock by as much or little time as required to keep the circuit in phase with the reference clock.

One well known circuit that compensates for variable propagation delays is the delay locked loop (DLL). FIG. 1 shows a conventional DLL circuit. The reference clock 17 is input to both the phase comparator 11 and to the delay line 10. The outputs of the delay line, called taps 14, are input to a multiplexer 13. In modern computer systems, consecutive taps produce outputs which are duplicates of the reference clock, but delayed by multiples of 60 picoseconds or less. FIG. 2 shows outputs of tap numbers zero (t0) and one (t1) along side the reference clock (CLK REF). Referring back to FIG. 1, the counter 12 selects which tap output 14 is propogated to the output 15 of the multiplexer 13. The output 15 of the multiplexer 13 is fed back to the other input 16 of the phase comparator 11, which outputs an indication of the phase error to the counter 12. The counter 12 responds to this phase error, counting upwards when CLK OUT 15 transitions before (leads) CLK REF 17, or counting downward when CLK OUT 15 transitions after (lags) CLK REF 17. The timing of the output 15 of the multiplexer 13 is advanced or delayed until its phase is coincident with the phase of the reference clock 17.

One problem with this circuit is that the delay line 10 can span several clock cycles. The number of clock cycles incorporated within the delay line is a function of the length of the delay line and the frequency of the input clock. Higher frequency clocks produce more cycles within a delay line of fixed length. Lower frequency clocks change more slowly over time and thus produce fewer cycles. The delay line must be long enough to hold one cycle of the slowest clock frequency used with it. If the computer operates at both 33 MHz and 66 MHz, then the delay line must be long enough to accommodate one 33 Mhz clock cycle. This same length will accommodate two 66 Mhz clock cycles. Thus when operating at 66 Mhz, the delay line contains two clock cycles.

Other factors besides frequency affect the number of clock cycles in the delay line. These include the operating temperature and operating voltage of the circuit. In modern computer circuits these factors often combine to produce a 4 to 1 ratio between the maximum and minimum number of clock cycles that appear in the delay line. The delay line will contain 4 times more clock cycles at the maximum combination of operating factors than at the minimum combination of factors. The most cycles will occur at the combination of highest clock frequency, lowest temperature, and highest operating voltage.

Multiple clock cycles within the delay line may cause the DLL to lock onto a tap which is less than ideal. The counter begins counting within the clock cycle it initializes into at power-up of the circuit. This clock cycle may not contain the tap which is optimum for locking the phase because of a phenomenon called jitter. As FIG. 3 shows, clock signals 60, 62, 64 output by taps on the delay line tend to jitter (vary) in time. The rising edge of an output does not always follow the rising edge of the input signal by a fixed delay. Instead, the delay varies by an error amount (jitter) which is proportional to a tap's depth within the delay line. Higher numbered taps located further from the delay line produce outputs with more jitter than lower numbered taps. This is a physical characteristic of delay lines, caused by noise and other environmental factors. It is not a characteristic of the reference clock, which tends to show very low jitter.

Therefore, a tap outputs more jitter than necessary if it is not within the first clock cycle contained by the delay line. The optimum tap is the one which minimizes the phase error and is also located within the first clock cycle within the delay line.

On power-up, the counter outputs a random value. It then proceeds to count up or down based upon the phase error corresponding to this random value. A reset signal can be applied to start the counter from 0, from which point it counts up to the first tap which minimizes the phase error. This is the optimum tap with the least jitter because it is within the first clock cycle within the delay line.

However, a system may contain circuits which must be operating during or immediately after the reset. Such circuits are especially common in modern high-speed computer systems. In these systems there is no time to ensure that the counter starts its count from 0 after reset. The delay involved may cause system failures or timing errors.

One solution is to produce two reset signals. One signal resets the counter a few tens of microseconds prior to the second signal which resets the system. This gives the counter time to count up to the first tap that locks the phase before the system reset is cleared. Systems without two resets cannot use this approach.

The present invention is an improved method and apparatus for selecting a range of taps for the counter to count over in a locked loop. The invention minimizes jitter in the output clock signal and does not require a separate reset signal to initialize the counter. The invention works irrespective of whether the phase of the output clock is leading or lagging the reference clock at power-on.

SUMMARY OF THE INVENTION

An innovative circuit is provided using a delay line which inputs a reference signal and outputs a number of delayed copies of the reference signal using taps. A phase comparator compares the input signal to an output signal and outputs an indication of the difference between them to a selector. The selector responds to the indication of the phase difference in selecting a tap output. The range of tap outputs selected from is determined using a detector coupled to the tap outputs. The detector detects a transition from a first predetermined signal level output by a first tap output to a second predetermined signal level output by a second tap output. The detector outputs an identification of the tap outputs between which the transition first occurs to a determiner, which determines a range for the selector based upon the received identification. The determiner outputs this range to the selector. The range includes those tap outputs which can reliably produce phase lock with the reference clock with a minimum of jitter.

BRIEF DESCRIPTION OF THE DRAWINGS

FIG. 10 shows how sampled taps may be distributed along the delay line, and how the range of taps to select from may be derived as a percentage of the delay at a sampled tap.

DETAILED DESCRIPTION

Figure 1:
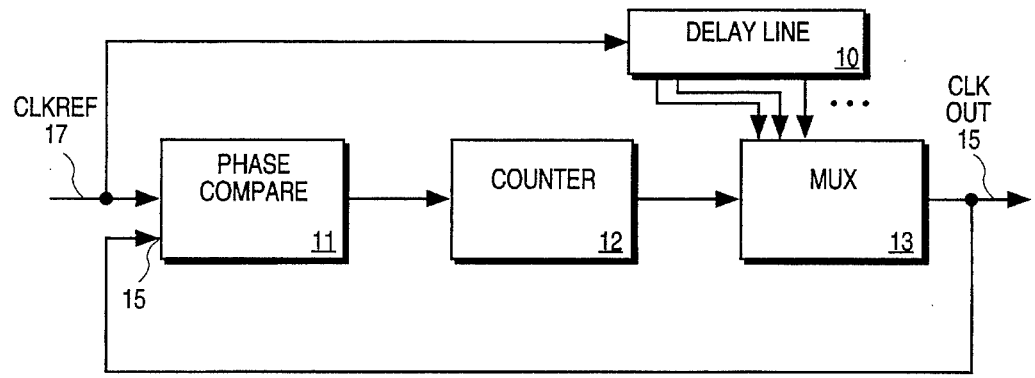
FIG. 1 is a block diagram of a prior art implementation of a DLL.
Figure 2:
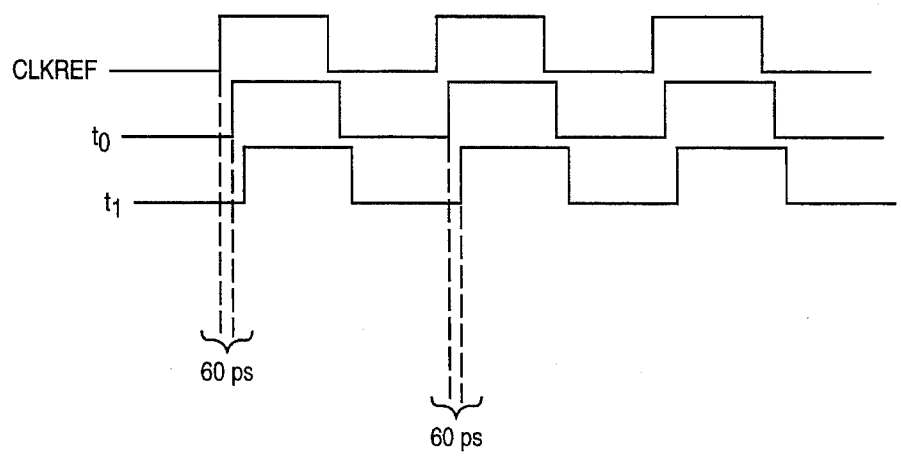
FIG. 2 is a prior art illustration of the outputs of the delay line taps which are delayed copies of the reference signal.
Figure 3:
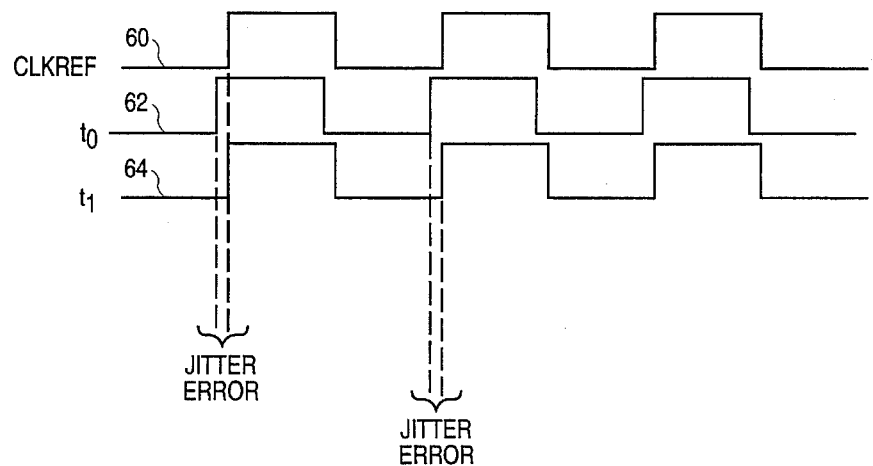
FIG. 3 is a prior art illustration of jitter in the output of a single tap over time.
Figure 4:
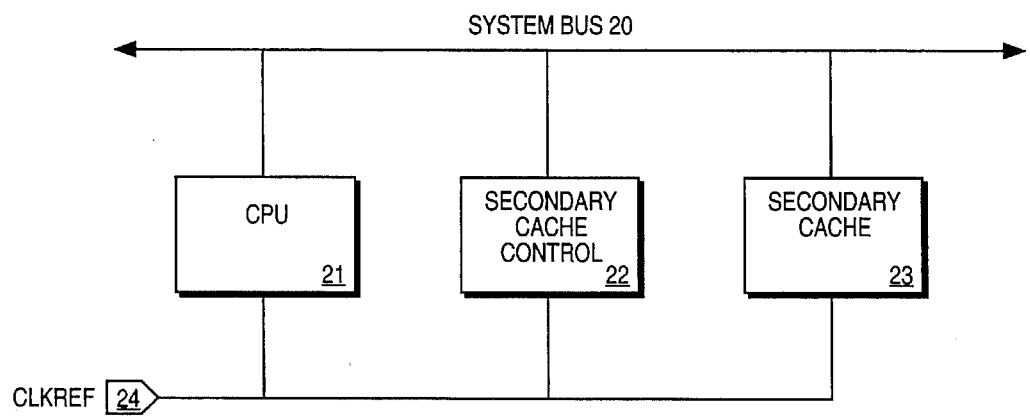
FIG. 4 is a block diagram showing subsystems of a computer system connected to a reference clock in one embodiment of the present invention.

A modern high speed microprocessor system, a simplified illustration of which is shown in FIG. 4, consists of number of subsystems such as the microprocessor (CPU 21), secondary cache controller 22 and the secondary cache memory 23. The communication between the subsystems is performed over the system bus 20. The system may include additional elements that are not essential to the subject matter of this invention and are therefore omitted for clarity from FIG. 4.

The subsystems are synchronized by means of the CLK REF signal 24. Each subsystem uses CLK REF 24 for sequencing internal logic circuits such as synchronous state machines, and for communicating over the system bus 20. CLK REF 24 is a low power reference clock which is distributed to all subsystems and regenerated locally by each one. The regenerated clocks are each synchronized with the reference clock. Because each local clock is synchronized with the reference clock, each is also each synchronized with one another.

Figure 5:
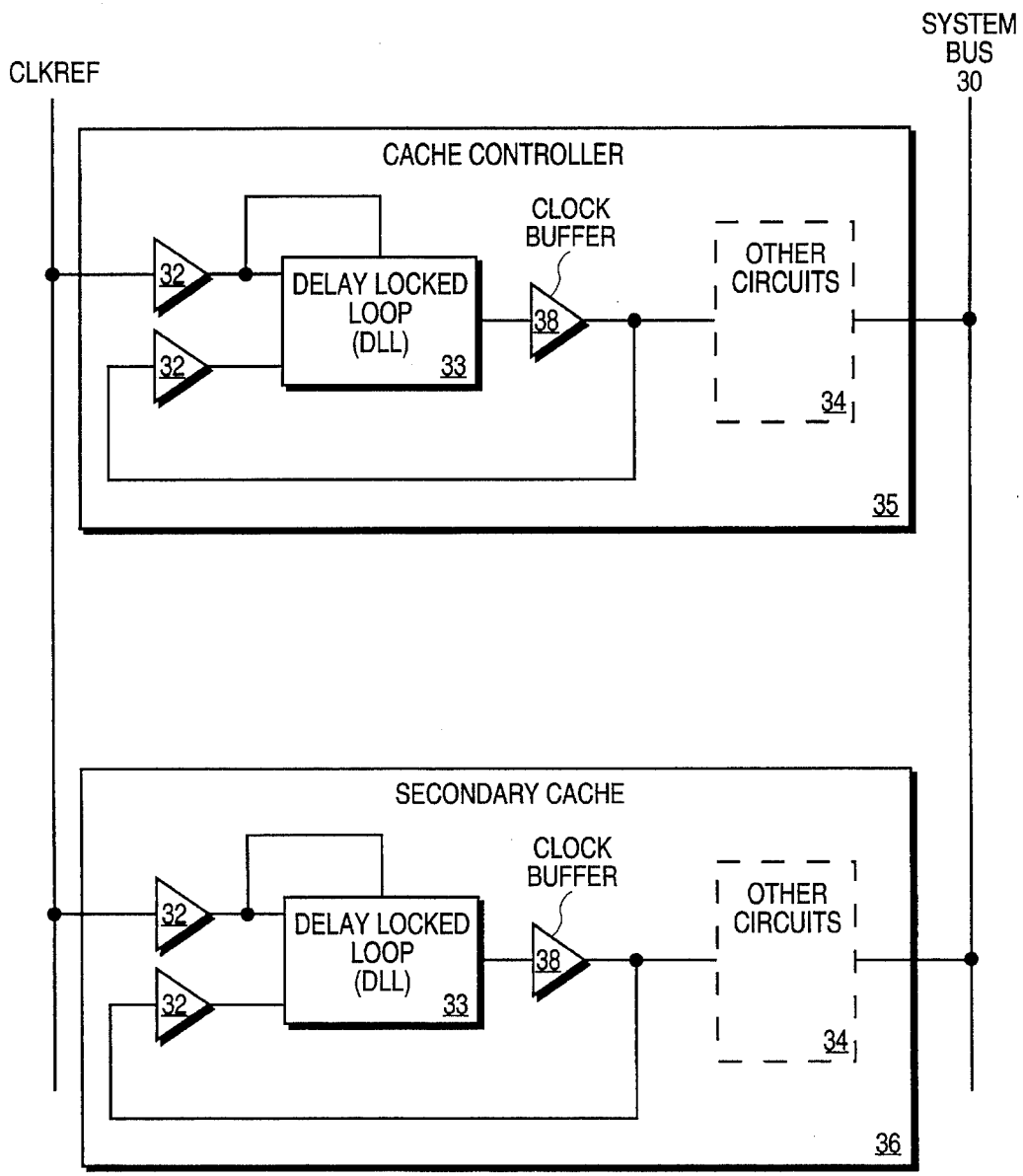
FIG. 5 is a block diagram of a DLL circuit used in the computer system of FIG. 4.

FIG. 5 shows the CLK REF signal 31 entering the cache controller 35 and the secondary cache memory 36. The CLK REF signal is passed through a clock buffer to provide the proper current and fan out to the circuits in the subsystem.

Figure 6:
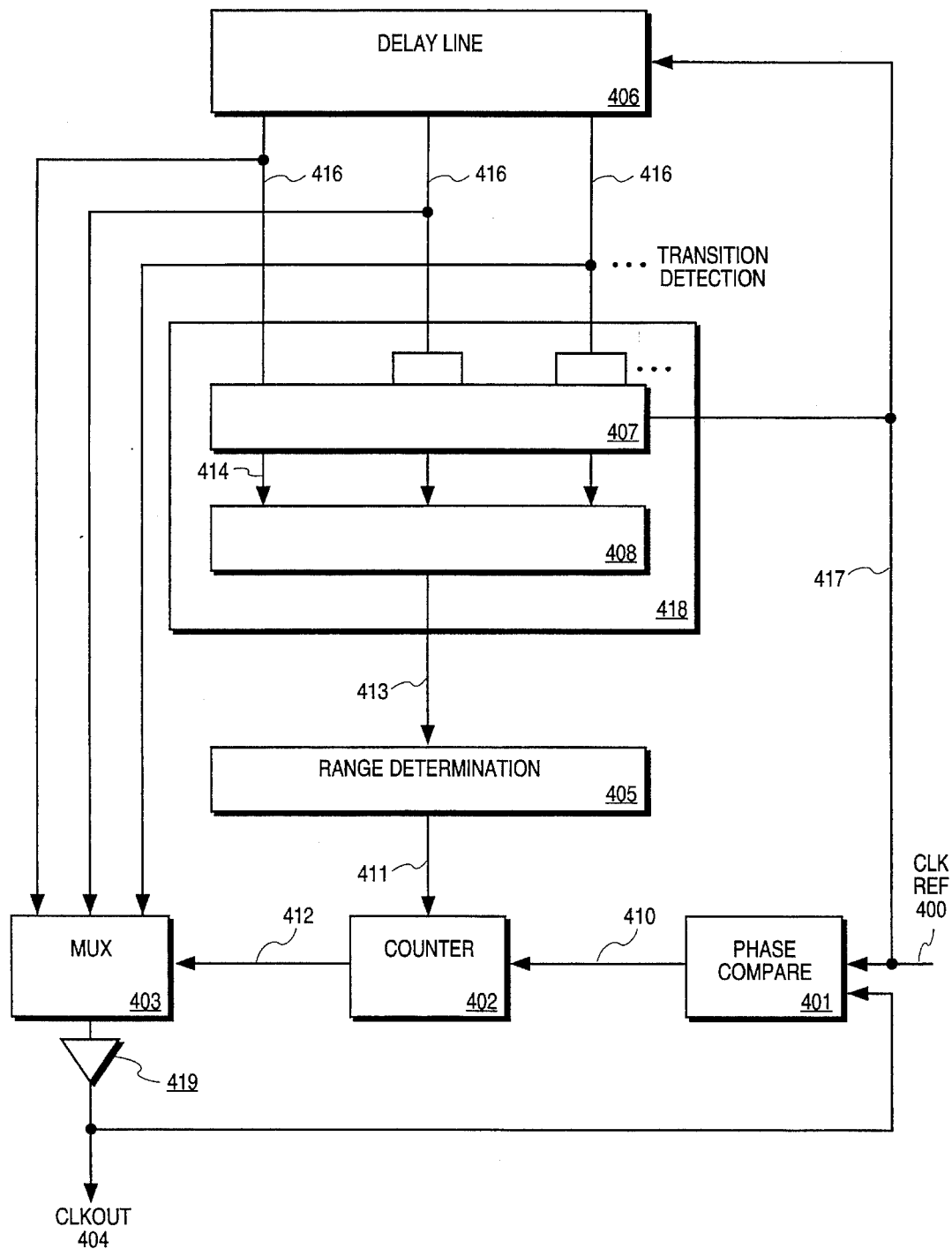
FIG. 6 is a block diagram showing the details of one embodiment of the invention.

In one embodiment of the invention, a DLL 33 is used to synchronize the multiple subsystems with the reference clock 31 (CLK REF). DLL 33 is shown in FIG. 6. The DLL comprises a phase comparator 401 and a delay line 406, both of which input the reference clock 400. The phase comparator 401 compares the reference clock 400 with the local clock 404 (CLK OUT) used by the circuits in the subsystem. The delay line 406 delays the reference clock 400 by predetermined increments and outputs the delayed copies using taps 416 to a multiplexer 403. The output of a counter 402 is input to the multiplexer 403 to select which tap output of the delay line 416 is fed through to the output of the multiplexer 403. The output 404 of the multiplexer 403 is fed back to the second input of the phase comparator 401 and also provided as the local clock 404 for the circuits in the subsystem.

The counter 402 is responsive to the output of the phase comparator 401; more particularly, the counter 402 counts up when CLK OUT 404 leads CLK REF 400, or down when CLK OUT 404 lags CLK REF 400. In the preferred embodiment the counter counts up or down by one (1) unit at a time. In other embodiments the counter may count in increments different than one (1), or in increments which are proportional to the phase error. When the counter 402 counts up it selects the outputs of taps 416 with greater delay to output from the multiplexer 403, which which reduces the phase error 410 from the comparator 401 by advancing the phase of CLK OUT 404. When the counter 402 counts down it selects the outputs of taps 416 with less delay to output from the multiplexer 403, which reduces the phase error 410 from the comparator 401 by retarding the phase of CLK OUT 404. In this manner the counter converges on the tap output 416 which minimizes the phase error 410 between CLK REF 400 and CLK OUT 404. The timing of CLK OUT 404 is advanced or retarded until its phase is coincident with the phase of CLK REF 400.

Figure 7B:
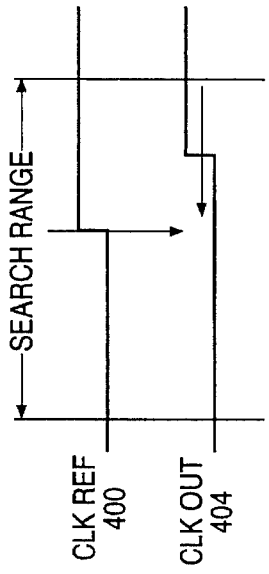
FIG. 7b shows how the phase of the output clock signal is retarded when it lags the reference clock.
Figure 7D:
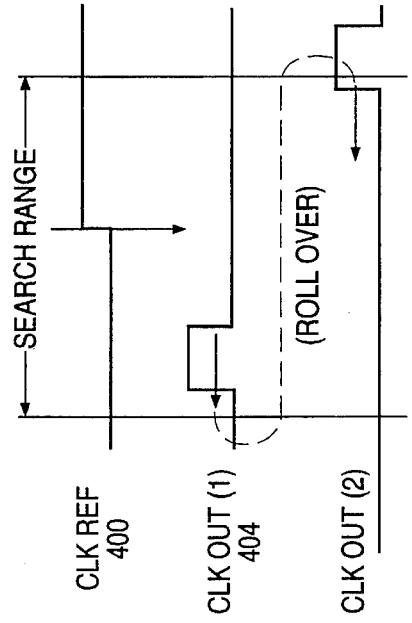
FIG. 7d shows one embodiment in which the counter rolls over upon falling below the lower search limit.
Figure 7A:
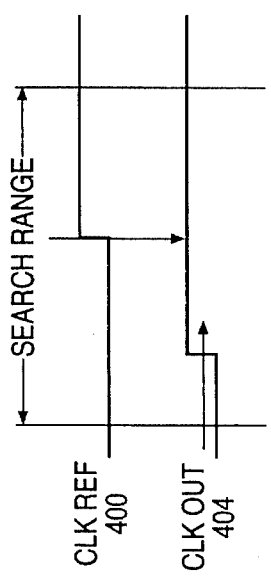
FIG. 7a shows how the phase of the output clock signal is advanced when it leads the reference clock.
Figure 7C:
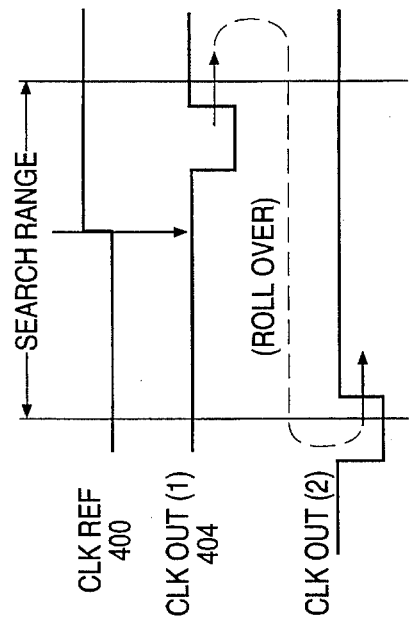
FIG. 7c shows one embodiment in which the counter rolls over upon exceeding the upper search limit.

FIG. 7a shows how the timing of CLK OUT 404 is advanced until its phase is coincident with the phase of CLK REF 400. The phase of CLK OUT 404 is leading the phase of CLK REF 400, and so the the counter counts up to advance the phase of CLK OUT 404. In FIG. 7b, the phase of CLK OUT 404 is lagging the phase of CLK REF 400, and so the the counter counts down to retard the phase of CLK OUT 404. In FIG. 7c the counter reaches the upper limit of its search range without achieving phase lock between CLK OUT 404 and CLK REF 400, and so the counter rolls rover to begin counting up from the beginning of the search range. In FIG. 7d the counter reaches the lower limit of its search range without achieving phase lock between CLK OUT 404 and CLK REF 400, and so the counter rolls over to begin counting down from the end of the search range.

Figure 8:
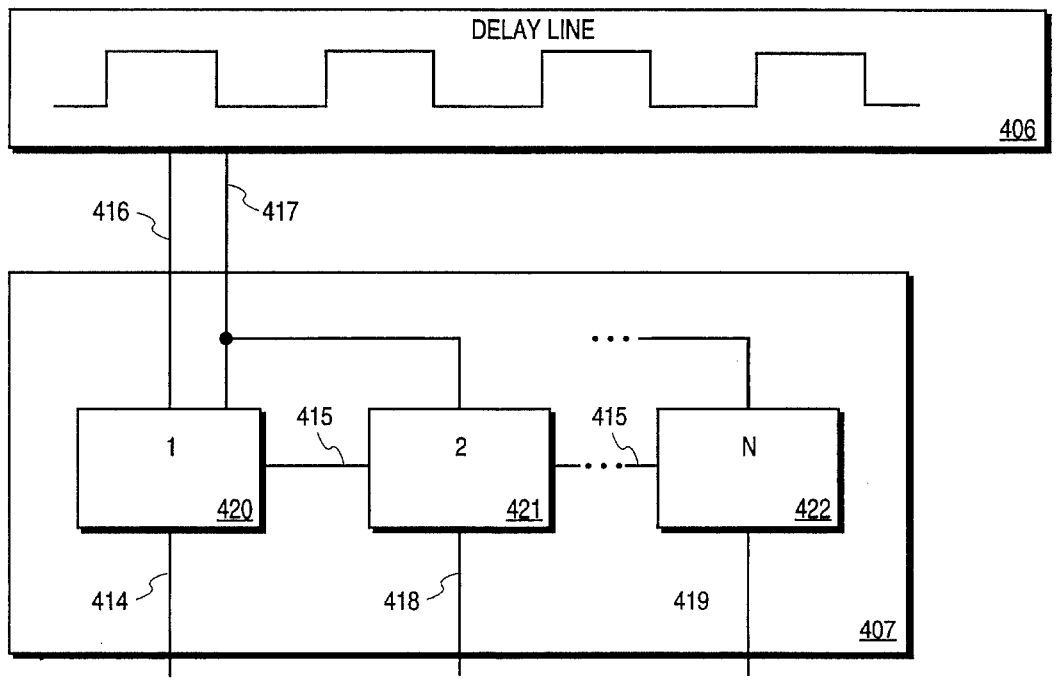
FIG. 8 shows a carry chain used to detect a clock edge in a delay line.

In one embodiment of the invention, the DLL uses a carry chain circuit 407 connected to a plurality of sampled taps. The plurality of sampled taps consists of pairs of taps along the length of the delay line 406, but may contain fewer than all of the taps along the delay line 406. Sampled pairs of taps do not have to be adjacent, but should be sufficiently close to one another to accurately detect a clock edge. FIG. 8 shows one embodiment of the carry chain 407, in which a comparator 420 compares the signals output by sampled pairs of taps in the plurality of connected taps. When one output in the pair compares with a first predetermined signal level, and the other output in the pair compares with a second predetermined signal level, then a clock edge, either rising or falling, has been detected within the delay line. FIG. 8 shows the propagation of a digital clock signal through the delay line 406, wherein an edge is indicated when one tap of a pair outputs a logical low and the other tap of the pair outputs a logical high, or vice versa. For example, in FIG. 8 the output of tap 416 is low and the output of tap 417 is high, and so a rising edge of the clock has been detected within the delay line 406. Taps 416 and tap 417 need not be adjacent, so long as they are sufficiently close to accurately predict the position of a clock edge within the delay line. When an edge is detected the output 414 of the comparator 420 is asserted, and a disable signal 415 is asserted and output to the next comparator 421 along the carry chain 407. The disable signal 415, when asserted, prevents the output 418 of the next comparator 421 from becoming asserted. The comparator 421 inputting an asserted disable signal 415 propagates the disable signal 415 to the next comparator 422 along the carry chain 407, disabling its output 419. In this manner, the outputs of all comparators further along the carry chain 407 are disabled, and so only the first detection of a clock edge will produce an output 414 from the carry chain 407. In general terms, the output 414 of any comparator 420 N is disabled if the output 414 of any comparator 420 M is asserted, M<N. A circuit 408 determines from the taps 414 output by the carry chain an indication 413 of the taps where the transition between signal levels occured. This range of taps 413 is input to range determination circuit 405, which uses the indication 413 to computer a range of taps 411 for the counter 402 to count over. The implementation of circuit 408 would be readily apparent to one of ordinary skill in the art, nor is the specific implementation of circuit 408 necessary for an understanding of the present invention.

Figure 9:
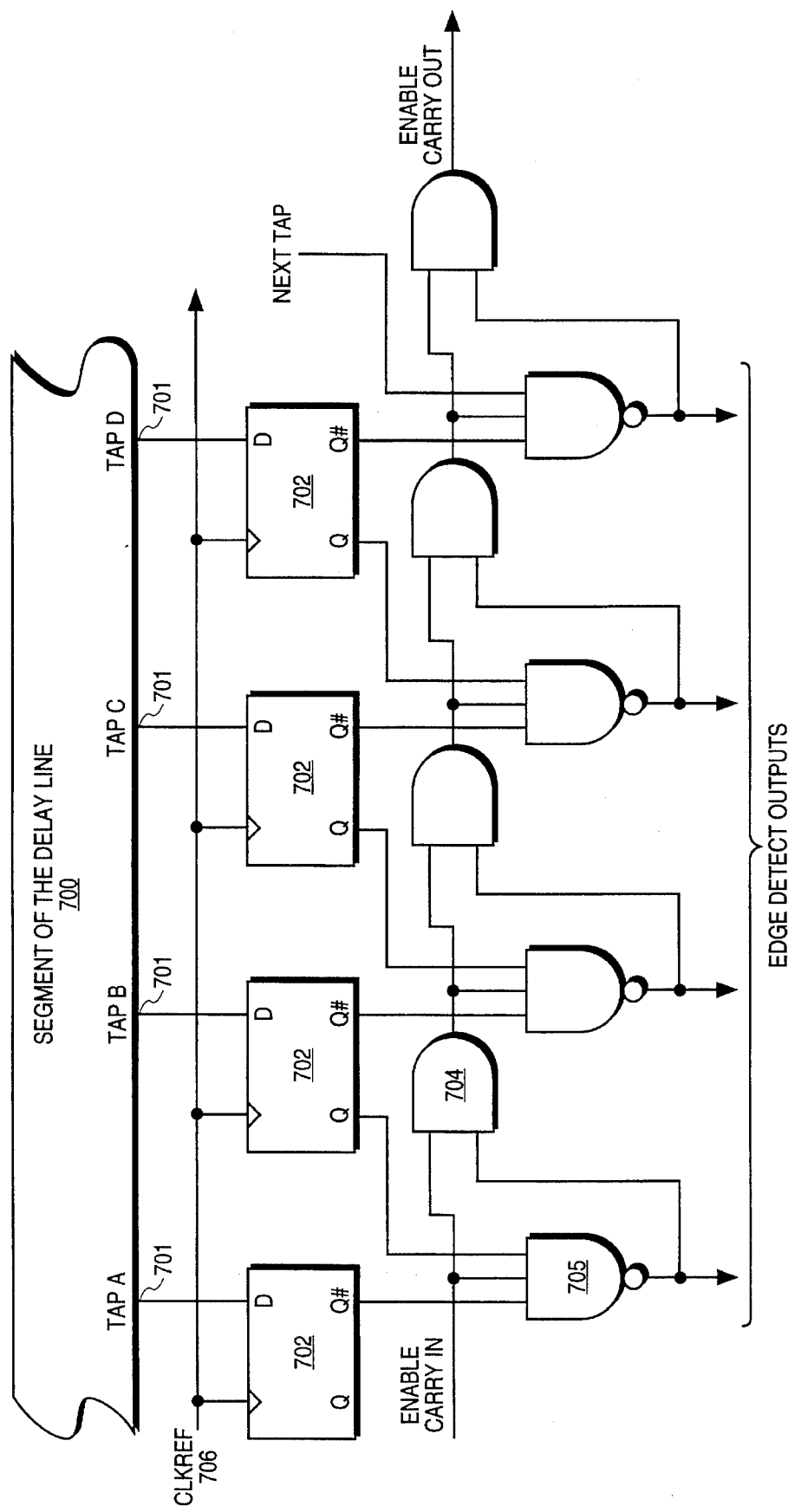
FIG. 9 shows shows details of one embodiment of the carry chain circuit.

FIG. 9 shows, in gate-level detail, the implemtation of one embodiment of the carry chain circuit. Each sampled tap 701 is input to a flip-flop 702 clocked by the reference clock, CLK REF 706. The flip-flops take a "snapshot" the sampled tap outputs 701 on the rising (or falling) edge of CLK REF 706. This snapshot is input to a chain of NAND gates 705. When a sampled tap with less delay outputs an active low and the next-sampled tap with more delay outputs an active high, the output of the NAND gate 705 is forced low. This low output is fed into an AND gate 704, which causes a low signal to propogate along the chain, disabling the outputs of later NAND gates 705. The first NAND gate 705 to output a logical low indicates the position of the first clock edge within the delay line. Although FIG. 9 shows the use of a serial carry to disable later outputs from the carry chain, more sophisticated carry-look-ahead techniques may also be employed to speed the propogation of the disable signal along the carry chain.

At lower clock frequencies, there are fewer clock cycles within the delay line, and hence fewer clock edges. As a result, for low clock frequencies the tap where the first edge occurs may have a large amount of delay, i.e the first edge may occur close to the end of the delay line. In the preferred embodiment, the distance between taps (as measured in the time delay between the signals output by the taps) increases farther along the delay line. Another way to say this is that fewer taps are sampled by the carry chain farther along the delay line. The distance between the taps can increase toward the end of the delay line, because only lower frequency clocks will indicate a first edge further along the delay line. The edges of lower frequency clocks are detected with less resolution because the resolution between taps as a percentage of the clock period remains unchanged as the tap delay increases. For example, the tap sample density can be arranged along the delay line in a geometric progression. In this case, sampled tap i is separated from sampled tap i−1 by D(i−1) taps, where D is a constant. Other possible sample tap distributions are logarithmic distributions and exponential distributions. Distributing the sampled taps in these fashions produces a savings in cost through the use of fewer carry chain circuits.

FIG. 10 shows one example of how the sample taps may be distributed along the delay line. In this example, a total of 19 sample taps are distributed at various points along the delay line. Column 1 shows the sample tap numbers, column 2 shows the actual tap numbers (corresponding to the delay of the tap output) of the sampled taps, and column 3 shows the delay in the reference signal corresponding to each sampled tap. Column 4 shows the percentage difference in the delay of a sampled tap and the delay of the sampled taps which precede and follow it. The distribution of taps in this figure is roughly geometric; the percentage change in delay between two consecutive sampled taps never exceeds 18.1%. Only 19 out of a possible 1024 taps are sampled, producing a significant savings in cost. There are 128 unsampled taps separating the last two sampled taps, but only 16 unsampled taps separating the first and second sampled taps.

The range of taps from which to select the output clock may be determined in a variety of ways. The following examples are intended merely to illustrate the variety of possible methods for determining the range, and it should be understood that the invention is not limited to the methods described herein.

Figure 11:
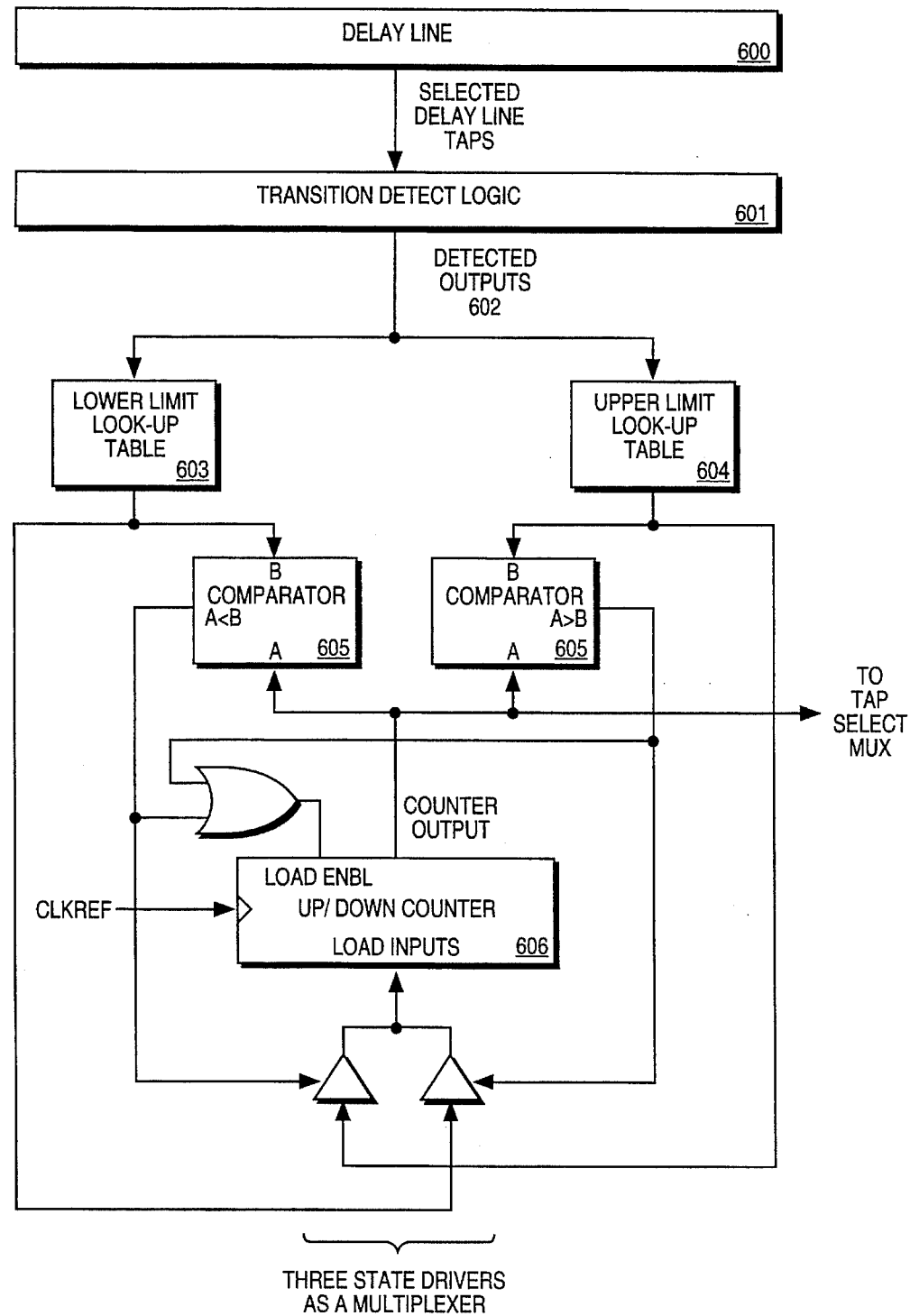
FIG. 11 shows one embodiment of the logic for selecting a range of tap outputs from which to select the output clock.

FIG. 11 shows one embodiment of the logic for determining a range of taps from which to select the output clock. The transition detection circuit 601 outputs an indication of the taps 602 between which a first transition is detected. The tap indication 602 is input to look up tables 603,604. The look up tables 603, 604 map the tap indications 602 to lower and upper limits for the counter 606 to count over. Comparators 605 compare the determined limits with the current counter output value. If the counter 606 is already counting within the determined limits, no change is made to the counter's range. If the counter 606 is counting down and has fallen below the lower limit of the desired range, then the upper limit is loaded as the counter's new value, and the counter 606 counts down from there (as shown in FIG. 7d). In other words, the counter 606 rolls over to the upper limit of the range and counts down from there. Likewise, if the counter 606 is counting up and has exceeded the upper limit of the desired range, then the lower limit is loaded as the counter's new value, and the counter 606 counts up from there (as shown in FIG. 7c). This roll-over of the counter 606 ensures that the circuit achieves phase lock even in situations where the counter 606 is initially counting away from the tap which achieves lock.

Figure 12:
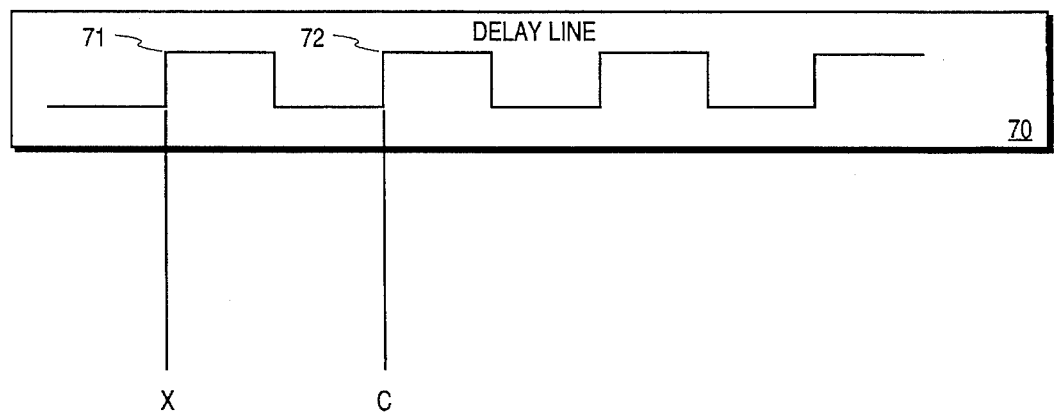
FIG. 12 shows a range within the delay line determined from the first rising edge of the clock.

In another embodiment shown in FIG. 12, the determined range is computed to comprise one full cycle of the reference clock. For example, if the first clock edge occurs at tap X, then the count might be restricted to taps numbered 0 through X+C, where C is a number chosen to comprise the first full cycle of the clock in the delay line, and the tap numbers correspond to the delay of the signal output by the tap. For a 66 MHz, 50% duty cycle reference clock with a 16 ns period, and a delay line with taps every 60 ps, there are 16 ns/60 ps=260 taps per clock cycle. In this example, X is a value between 0 and 260 because the first rising edge of the reference clock will occur within the first 260 taps within the delay line. C is equal to X+260, and so is in the range 260 to 520, depending on the value of X. In another embodiment, the carry chain outputs an indication of both the first and second rising edges of the clock. In FIG. 12, four clock cycles are contained within the delay line 70. X coincides with the first rising clock edge 71. C is determined to correspond to the rising edge 72 which immediately follows X, or the last tap in the delay line, whichever comes first. Selecting the range in this manner simplifies the design of the phase comparator. The phase comparator can output a count-down indication to reliably achieve phase lock when the output clock is lagging the reference clock in phase (output edge follows reference edge in time). Likewise, when the output clock is leading the reference clock in phase, the phase comparator can output a count-up indication (output edge precedes reference edge in time) to reliably achieve phase lock.

Referring back to FIG. 6, in another embodiment the set-up and delay time of the transition-detection circuitry 418 is tuned to approximately match the propogation delay of the MUX 403 and output clock buffer 419. The transition-detection circuitry 418 will then always sample CLK REF 400 at a time when CLK REF 400 and CLK OUT 404 are approximately in phase. The tap range may then be computed with confidence as a percentage of the delay at any sampled tap where a transition is detected, as shown in FIG. 10. In this figure, the lower limit of the range is chosen to comprise the sampled tap two sample positions down the delay line from the tap where the transition is detected. The upper limit is chosen to comprise the sampled tap two positions up the delay line from where the transition is detected. As the figure shows, this results in maximum range of 54.3% of the delay at the sample tap where the transition is detected (Note: The first two taps have a maximum range which is anomolously high, due to setting the lower limit of the range at tap 0). The minimum range is 39.3% of the delay at the sample tap (Note: the minimum range is artificially low at the last sample tap due to clipping the upper limit of the range at tap 1024). These ranges are adequate to ensure phase lock of CLK OUT 404 with CLK REF 400, because, as explained previously, the transition-detection circuitry 418 will always sample CLK REF 400 at a time when CLK REF 400 and CLK OUT 404 are approximately in phase.

The DLL circuit of the present invention functions properly even when the reference clock frequency is in flux. Upon power up, the reference clock may have an initially transient frequency content. For example, in a 66 MHz system the reference clock might be initially unstable and running at 14 Mhz for a few microseconds or milliseconds after power-up. The tap corresponding to the first clock edge might have a large amount of delay at 14 MHz. But after a few milliseconds the reference clock snaps to its higher frequency of 66 Mhz, the first edge very quickly shifts to a tap with a low delay. The counter's range very quickly adjusts around the lower tap because the carry chain immediately outputs an indication of the new position of the first edge of the clock, which is used to determine a new range for the counter.

The specific arrangements and methods described herein are merely illustrative of the principles of the invention. Numerous modifications in form and detail may be made by those of ordinary skill in the art without departing from the scope of the present invention. For example, the invention as described herein is not limited to any particular duty cycle for the clock signals nor is it limited to digital clock signals.

Although this invention has been shown in relation to a particular embodiment, it should not be considered so limited. Rather, the invention is limited only by the scope of the appended claims.

We claim:

1. A circuit to lock a first phase of a first signal to a second phase of a second signal, the circuit comprising:

a delay line having a plurality of tap outputs, the delay line coupled to receive the first signal, each tap output of the plurality of tap outputs comprising a delayed version of the first signal;

a phase comparator coupled to receive the first signal and the second signal, the phase comparator detecting a phase difference between the first phase and the second phase;

a selector coupled to the phase comparator for selecting a locking tap output from the plurality of tap outputs, the locking tap output providing the second signal, the selector using the phase difference to select the locking tap output;

a detector coupled to the plurality of tap outputs detecting a transition from a first predetermined signal level output by a first tap output of the plurality of tap outputs to a second predetermined level output by a second tap output of the plurality of tap outputs, the detector outputting an identification of the first and second tap outputs of the plurality of tap outputs; and a range determination circuit receiving the identification of the first and second tap outputs of the plurality of tap outputs from the detector and determining a range of tap outputs of the plurality of tap outputs from which to select the locking tap output, the range determination circuit outputting the range of tap outputs to the selector, the selector selecting the locking tap output from the range of tap outputs.

2. The circuit of claim 1 in which the selector comprises a counter and a multiplexer, the multiplexer comprising an input and an output, the input of the multiplexer being coupled to the plurality of tap outputs, the counter counting in a direction determined by a sign of the phase difference output by the comparator, the counter outputting a count, the multiplexer using the count to select the locking tap output from the plurality of tap outputs to pass to the output of the multiplexer.

3. The circuit of claim 2 in which the count is set to an upper limit of the range of tap outputs when the counter counts below a lower limit of the range of tap outputs.

4. The circuit of claim 2 in which the count is set to a lower limit of the range of tap outputs when the counter counts above an upper limit of the range of tap outputs.

5. The circuit of claim 1 wherein each tap output of the plurality of tap outputs comprises the first signal delayed by a signal delay, a difference between a first signal delay comprised of a first tap output of a pair of tap outputs of the plurality of tap outputs and a second signal delay comprised of a second tap output of the pair of tap outputs of the plurality of tap outputs being proportional to the first signal delay comprised of the first tap output of the pair of tap outputs of the plurality of tap outputs.

6. The circuit of claim 1 in which each tap output of the plurality of tap outputs comprises the first signal delayed by a signal delay, a maximum difference between a first signal delay comprised of a first tap output of the range of tap outputs and a second signal delay comprised of a second tap output of the range of tap outputs comprising at least one cycle of the first signal but less than two cycles of the first signal.

7. The circuit of claim 1 in which the range of tap outputs comprises a lower limit and an upper limit, the lower limit comprising a lower limit tap, the upper limit comprising an upper limit tap, the output of the lower limit tap comprising the first signal delayed by a lower limit delay, the upper limit tap comprising the first signal delayed by an upper limit delay, the lower limit delay being less than the upper limit delay.

8. A circuit to lock a first phase of a first signal to a second phase of a second signal, the circuit comprising:

delay means having a plurality of tap outputs, the delay means receiving the first signal, each tap output of the plurality of tap outputs comprising a delayed version of the first signal;

phase comparator means receiving the first signal and the second signal, the phase comparator means detecting a phase difference between the first phase and the second phase;

selector means coupled to the phase comparator means for selecting a locking tap output from the plurality of tap outputs, the locking tap output providing the second signal, the selector means using the phase difference for selecting the locking tap output;

detector means coupled to the plurality of tap outputs for detecting a transition from a first predetermined signal level output by a first tap output of the plurality of tap outputs to a second predetermined level output by a second tap output of the plurality of tap outputs, the detector means outputing an identification of the first and second tap outputs of the plurality of tap outputs; and range determination means for determining a range of tap outputs of the plurality of tap outputs from which to select the locking tap output, the range determination means receiving the identification of the first and second tap outputs of the plurality of tap outputs from the detector means and outputing the range of tap outputs to the selector means, the selector means selecting the locking tap output from the range of tap outputs.

9. The circuit of claim 8 in which the selector means comprises a counting means and a multiplexing means, the multiplexing means comprising an input and an output, the input of the multiplexing means being coupled to the plurality of tap outputs, the counting means counting in a direction determined by a sign of the phase difference output by the comparator means, the counting means outputting a count, the multiplexing means using the count for selecting the locking tap output from the plurality of tap outputs to pass to the output of the multiplexing means.

10. The circuit of claim 9 in which the count is set to an upper limit of the range of tap outputs when the counting means counts below a lower limit of the range of tap outputs.

11. The circuit of claim 9 in which the count is set to a lower limit of the range of tap outputs when the counting means counts above an upper limit of the range of tap outputs.

12. The circuit of claim 8 wherein each tap output of the plurality of tap outputs comprises the first signal delayed by a signal delay, a difference between a first signal delay comprised of a first tap output of a pair of tap outputs of the plurality of tap outputs and a second signal delay comprised of a second tap output of the pair of tap outputs of the plurality of tap outputs being proportional to the first signal delay comprised of the first tap output of the pair of tap outputs.

13. The circuit of claim 8 in which each tap output of the plurality of tap outputs comprises the first signal delayed by a signal delay, a maximum difference between a first signal delay comprised of a first tap output of the range of tap outputs and a second signal delay comprised of a second tap output of the range of tap outputs comprising at least one cycle of the first signal but less than two cycles of the first signal.

14. The circuit of claim 8 in which the range of tap outputs comprises a lower limit and an upper limit, the lower limit comprising a lower limit tap, the upper limit comprising an upper limit tap, the output of the lower limit tap comprising the first signal delayed by a lower limit delay, the upper limit tap comprising the first signal delayed by an upper limit delay, the lower limit delay being less than the upper limit delay.

15. In a delay circuit having a delay line coupled to receive a first signal, the first signal including a first phase, the delay line including a plurality of tap outputs, each tap output of said plurality of tap outputs including the first signal with a signal delay, a method for determining a range of tap outputs of the plurality of tap outputs from which to select a second signal in said delay circuit, comprising the steps of:

comparing a first tap output to a first predetermined signal level;

comparing a second tap output to a second predetermined signal level;

outputting a first assertion signal when the first tap output matches the first predetermined signal level and the second tap output matches the second predetermined signal level;

outputting a second assertion signal to disable first assertion signals being outputted from comparison of tap outputs with signal delays greater than the signal delays of the first and second tap outputs; and determining the range of tap outputs from which to select the second signal based upon the first assertion signal.

16. The method of claim 15 wherein a difference between the signal delay of the first tap output and the signal delay of the second tap output is proportional to the signal delay of the first tap output.

17. The method of claim 15 wherein the signal delay of the first tap output is less than the signal delay of the second tap output, the method further comprising the steps of:

determining a lower limit of the range of tap outputs from which to select the second signal, the lower limit comprising a lower tap output, the lower tap output comprising a smaller signal delay than the signal delay of the first tap output; and determining an upper limit of the range of tap outputs from which to select the second signal, the upper limit comprising an upper tap output, the upper tap output comprising a larger signal delay than the signal delay of the first tap output.

18. A computer system comprising:

a first device outputting a first clock signal, the first clock signal having a first phase;

a second device coupled to the first clock signal; and a circuit to generate a second clock signal in phase with the first clock signal, the second clock signal having a second phase, the circuit comprising:

a delay line having a plurality of tap outputs, the delay line coupled to receive the first signal, each tap output of the plurality of tap outputs comprising a delayed version of the first clock signal;

a phase comparator coupled to receive the first clock signal and the second clock signal, the phase comparator detecting a phase difference between the first phase and the second phase;

a selector coupled to the phase comparator for selecting a locking tap output from the plurality of tap outputs, the locking tap output providing the second clock signal, the selector using the phase difference to select the locking tap output;

a detector coupled to the plurality of tap outputs detecting a transition from a first predetermined signal level output by a first tap output of the plurality of tap outputs to a second predetermined level output by a second tap output of the plurality of tap outputs, the detector outputting an identification of the first and second tap outputs of the plurality of tap outputs; and a range determination circuit receiving the identification of the first and second tap outputs of the plurality of tap outputs from the detector and determining a range of tap outputs of the plurality of tap outputs from which to select the locking tap output, the range determination circuit outputting the range of tap outputs to the selector, the selector selecting the locking tap output from the range of tap outputs.

19. The computer system of claim 18 in which the selector comprises a counter and a multiplexer, the multiplexer comprising an input and an output, the input of the multiplexer being coupled to the plurality of tap outputs, the counter counting in a direction determined by a sign of the phase difference output by the comparator, the counter outputting a count, the multiplexer using the count for selecting the locking tap output from the plurality of tap outputs to pass to the output of the multiplexer.

20. The computer system of claim 19 in which the count is set to an upper limit of the range of tap outputs when the counter counts below a lower limit of the range of tap outputs.

21. The computer system of claim 19 in which the count is set to a lower limit of the range of tap outputs when the counter counts above an upper limit of the range of tap outputs.

22. The circuit of claim 18 wherein each tap output of the plurality of tap outputs comprises the first signal delayed by a signal delay, a difference between a first signal delay comprised of a first tap output of a pair of tap outputs of the plurality of tap outputs and a second signal delay comprised of a second tap output of the pair of tap outputs of the plurality of tap outputs being proportional to the first signal delay comprised of the first tap output of the pair of tap outputs.

23. The circuit of claim 18 in which each tap output of the plurality of tap outputs comprises the first signal delayed by a signal delay, a maximum difference between a first signal delay comprised of a first tap output of the range of tap outputs and a second signal delay comprised of a second tap output of the range of tap outputs comprising at least one cycle of the first clock signal but less than two cycles of the first clock signal.

24. The circuit of claim 18 in which the range of tap outputs comprises a lower limit and an upper limit, the lower limit comprising a lower limit tap, the upper limit comprising an upper limit tap, the output of the lower limit tap comprising the first signal delayed by a lower limit delay, the upper limit tap comprising the first signal delayed by an upper limit delay, the lower limit delay being less than the upper limit delay.

* * * * *